(12) United States Patent
Wang et al.

(10) Patent No.: US 11,056,548 B1
(45) Date of Patent: Jul. 6, 2021

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Shaobo Wang, Wuhan (CN); Caiqin Chen, Wuhan (CN); Yiyi Wang, Wuhan (CN)

(*) Notice: Subject to any disclaimer, the term of this patent is extended or adjusted under 35 U.S.C. 154(b) by 281 days.

(21) Appl. No.: 16/344,019

(22) PCT Filed: Oct. 8, 2018

(86) PCT No.: PCT/CN2018/109289
§ 371 (c)(1),
(2) Date: Apr. 23, 2019

(87) PCT Pub. No.: WO2020/051962
PCT Pub. Date: Mar. 19, 2020

(30) Foreign Application Priority Data

Sep. 12, 2018 (CN) .......................... 201811062627.4

(51) Int. Cl.
*H01L 27/32* (2006.01)
*H01L 51/00* (2006.01)
*H01L 51/52* (2006.01)
*H01L 27/12* (2006.01)

(52) U.S. Cl.
CPC ...... *H01L 27/3246* (2013.01); *H01L 27/1218* (2013.01); *H01L 27/3262* (2013.01); *H01L 51/0097* (2013.01); *H01L 51/5253* (2013.01)

(58) Field of Classification Search
CPC ............. H01L 27/3246; H01L 27/1218; H01L 27/3262; H01L 51/0097; H01L 51/5253
USPC .......................................................... 257/40
See application file for complete search history.

(56) References Cited

U.S. PATENT DOCUMENTS

| | | |
|---|---|---|
| 2016/0307971 A1 | 10/2016 | Jeon |
| 2016/0315284 A1 | 10/2016 | Jeon |
| 2018/0183004 A1 | 6/2018 | Shin |
| 2018/0205037 A1 | 7/2018 | Kim et al. |
| 2018/0240852 A1 | 8/2018 | Chen |

FOREIGN PATENT DOCUMENTS

| | | |
|---|---|---|
| CN | 106057853 A | 10/2016 |
| CN | 106098724 A | 11/2016 |
| CN | 106409869 A | 2/2017 |
| CN | 106711171 A | 5/2017 |
| CN | 207637803 U | 7/2018 |
| WO | 2017113256 A1 | 7/2017 |

*Primary Examiner* — Dzung Tran

(57) ABSTRACT

A display panel is provided. The display panel includes: a flexible substrate including a display area and a non-display area; a thin film transistor layer formed on the flexible substrate; grooves formed in the thin film transistor layer corresponding to the non-display area; a planarization layer and a pixel definition layer disposed on the thin film transistor layer respectively; bumps formed in the non-display area after patterning the planarization layer and the pixel definition layer; and a light emitting layer and a thin film encapsulation layer formed on the planarization layer in order, wherein the thin film encapsulation layer covers the bumps and the grooves.

18 Claims, 2 Drawing Sheets

DISPLAY PANEL

FIELD OF THE DISCLOSURE

The present disclosure relates to the technical field of display screens, and more particularly, to a display panel.

DESCRIPTION OF THE RELATED ART

Organic Light-Emitting Diode (OLED) devices, which have the sensitivity to water and oxygen, need to be encapsulated by a thin film after finalizing a light emitting layer in order to reduce the erosion of external water and oxygen, thus prolonging their life.

Thin film encapsulation for OLED devices proceeds after finalizing a light emitting layer. As shown in FIG. 1, a thin film encapsulation layer 10 covers and encapsulates the whole display area 11 together with gate on array (GOA) circuits 12 surrounding the display area 11. When an interlayer dielectric (ILD) film 13 is formed by plasma enhanced chemical vapor deposition (PECVD) process, the temperature for the formation need to reach at least 350° C. due to high requirements for qualities of films. Through adjusting working conditions, it can continuously improve stresses between films and thus cause films to match well, without peeling due to the excessive difference of stresses in the same position. However, because light emitting materials are extremely sensitive to temperatures, the thin film encapsulation can only proceed at low temperatures approximately between 80° C. and 100° C., causing the quality of the thin film encapsulation layer 10 to be different from the quality of the ILD film 13 on a thin-film transistor (TFT) substrate and resulting in inconsistent stresses between films. Once the excessive difference of stresses causes films to peel, the effect of the thin film encapsulation will be difficult to be realized. For the portion of display panels on glass substrates, films most easily peel around the edges of the glass substrates.

Therefore, it is required to provide a display panel in order to solve deficiencies existed in current technologies.

SUMMARY

The present disclosure provides a display panel to improve the risk of peeling for a thin film encapsulation layer and lower layers of the display panel.

The technical solution for solving the problems above is described as follows:

A display panel, provided in the present disclosure, including: a flexible substrate including a display area and a non-display area which is positioned around the display area; a thin film transistor layer formed on the flexible substrate; a plurality of grooves formed in the thin film transistor layer and positioned in the non-display area around the display area; a planarization layer disposed on the thin film transistor layer; a pixel definition layer disposed on the planarization layer and defining a pixel area; at least one bump formed in the parts of the planarization layer and the pixel definition layer, which are located in the non-display area, and located between each two adjacent grooves through patterning; a light emitting layer formed on the planarization layer and disposed corresponding to the pixel area; and a thin film encapsulation layer formed on the light emitting layer and configured to package the light emitting layer, wherein the thin film encapsulation layer covers the at least one bump and the plurality of grooves in the non-display area.

In the display panel of the present disclosure, wherein the at least one bump or the plurality of grooves are disposed at an interval and in the area from an edge of the light emitting layer to the edge of the thin film encapsulation layer, which faces the same direction as the light emitting layer.

In the display panel of the present disclosure, wherein the plurality of grooves having different depths are disposed in the layers from the thin film transistor layer to a surface of the flexible substrate.

In the display panel of the present disclosure, wherein the thin film encapsulation layer corresponding to the non-display area has a section whose shape matches a shape of the at least one bump or shapes of the plurality of grooves.

In the display panel of the present disclosure, wherein each of the plurality of grooves has a trapezoid or ladder-shaped section.

In the display panel of the present disclosure, wherein the at least one bump includes at least one first bump located between the two adjacent grooves through patterning the planarization layer.

In the display panel of the present disclosure, wherein at least one second bump is located between the two adjacent grooves through patterning the pixel definition layer on parts of the at least one first bump.

In the display panel of the present disclosure, further including an organic spacing layer formed on the pixel definition layer, wherein at least one third bump is located between the two adjacent grooves through patterning the organic spacing layer on parts of the at least one second bump and in the non-display area.

In the display panel of the present disclosure, wherein the at least one bump has a trapezoid or ladder-shaped section.

A display panel for solving the problems above, further provided in the present disclosure, including: a flexible substrate including a display area and a non-display area which is positioned around the display area; a thin film transistor layer formed on the flexible substrate; a plurality of grooves formed in the thin film transistor layer and positioned in the non-display area around the display area; a planarization layer disposed on the thin film transistor layer; a pixel definition layer disposed on the planarization layer and defining a pixel area; at least one bump formed in the parts of the planarization layer and the pixel definition layer, which are located in the non-display area, and located between each two adjacent grooves through patterning; a light emitting layer formed on the planarization layer and disposed corresponding to the pixel area; and a thin film encapsulation layer formed on the light emitting layer and configured to package the light emitting layer, wherein the thin film encapsulation layer covers the at least one bump and the plurality of grooves in the non-display and wherein the at least one bump and the plurality of grooves, corresponding to the thin film transistor layer in the non-display area, are divided into sections and disposed at an interval.

In the display panel of the present disclosure, wherein the at least one bump or the plurality of grooves are disposed at an interval and in the area from an edge of the light emitting layer to the edge of the thin film encapsulation layer, which faces the same direction as the light emitting layer.

In the display panel of the present disclosure, wherein the plurality of grooves having different depths are disposed in the layers from the thin film transistor layer to a surface of the flexible substrate.

In the display panel of the present disclosure, wherein the thin film encapsulation layer corresponding to the non-display area has a section whose shape matches a shape of the at least one bump or shapes of the plurality of grooves.

In the display panel of the present disclosure, wherein each of the plurality of grooves has a trapezoid or ladder-shaped section.

In the display panel of the present disclosure, wherein the at least one bump includes at least one first bump located between the two adjacent grooves through patterning the planarization layer.

In the display panel of the present disclosure, wherein at least one second bump is located between the two adjacent grooves through patterning the pixel definition layer on parts of the at least one first bump.

In the display panel of the present disclosure, further including an organic spacing layer formed on the pixel definition layer, wherein at least one third bump is located between the two adjacent grooves through patterning the organic spacing layer on parts of the at least one second bump and in the non-display area.

In the display panel of the present disclosure, wherein the at least one bump has a trapezoid or ladder-shaped section.

In the preparation of the array substrate of the display panel provided in the disclosure, grooves or bumps can be formed in a non-display area surrounding a display area while applying photolithography to different layers. In a thin film encapsulation process, a thin film encapsulation layer covers the grooves or the bumps in the non-display, so that the thin film encapsulation layer and the other layers that lie beneath it are embedded each other and thus tightly combined without peeling easily. At the same time, inorganic layers in the thin film encapsulation layer can contact inorganic layers in lower layers through the grooves, so that the sealing effect of the thin film encapsulation layer will be better. In addition, such design enlarges contacting areas between the thin film encapsulation layer and the other layers that lie beneath the thin film encapsulation layer, causing the abilities of adherence of the layers to further increase without peeling easily.

BRIEF DESCRIPTION OF THE DRAWINGS

In order to more clearly illustrate the embodiments of the present disclosure or technical solutions in current technologies, the drawings required for describing of the embodiments or current technologies will be briefly introduced below. It is obvious that the following drawings are merely some embodiments of the present disclosure, a person having ordinary skill in this field can obtain other drawings according to these drawings under the premise of not paying creative works.

DETAILED DESCRIPTION OF THE EMBODIMENTS

The following embodiments are described with reference to the accompanying drawings, which exemplify the realization of the invention. The directional terminologies of the invention, such as "top", "bottom", "front", "back", "left", "right", "inner", "outer", "side" and the like are merely the directions with reference to the accompanying drawings. Therefore, the aforesaid directional terminologies are used to describe and comprehend the invention without limiting the invention. In the following drawings, the units having similar structures are marked by same numerals.

Because encapsulation for display panels in current technologies can only proceed at low temperatures, the quality of the thin film encapsulation layer is different from the quality of the ILD film 13 contacting it, which causes films to peel easily. The forgoing deficiencies can be solved in embodiments of the present invention.

Figure 1:
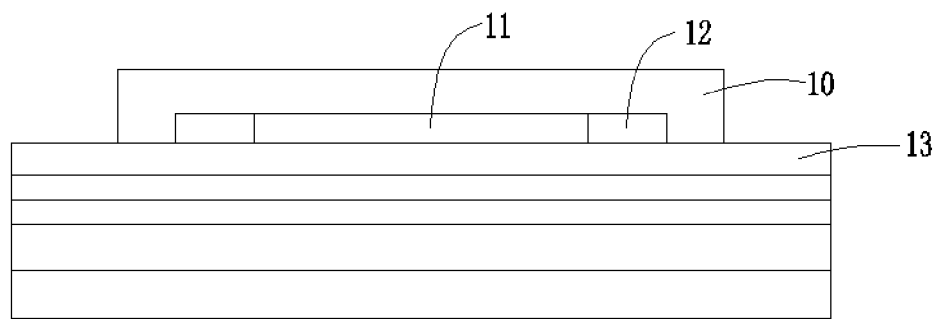
FIG. 1 is a schematic diagram of the encapsulation for a display panel in current technologies.
Figure 2:
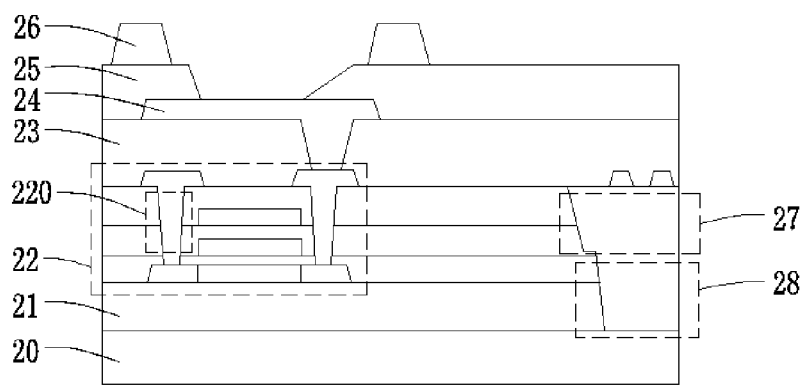
FIG. 2 is a schematic diagram of a partial structure of a display panel according to a first embodiment of the present invention.

Referring to FIG. 2, which is a schematic diagram of a partial structure of a display panel according to a first embodiment of the present invention. The display panel includes: a flexible substrate 20 including a display area and a non-display area which is positioned around the display area; a buffer layer 21 formed on the flexible substrate 20; a thin film transistor layer 22 formed on the buffer layer 21; a plurality of grooves formed in the thin film transistor layer 22 and positioned in the non-display area around the display area (see FIG. 3); a planarization layer 23 disposed on the thin film transistor layer 22; an anode layer 24 formed on the planarization layer 23; a pixel definition layer 25 disposed on the planarization layer 23 and defining a pixel area in the position corresponding to the anode layer 24; spacers 26 formed on the pixel definition layer 25 to surround the pixel area and used as supports for evaporating a light emitting layer (not shown) in the pixel area; a thin film encapsulation layer formed on the light emitting layer and configured to package the light emitting layer. Notches filled with organic materials are often arranged in specific bendable areas such as a bonding area of a non-display area in order to improve the flexibility of the parts of the display panel that correspond to the bendable areas. For example, the notches may include a first notch 28 and a second notch 27, wherein the first notch 28 and the second notch 27 can be located in the same position and run through the thin film transistor layer 22 and the buffer layer 21. According to a display panel of the invention, the grooves can be formed in the non-display area surrounding the display area, while forming the first notch 28, the second notch 27 and the through holes 220 of source electrodes and drain electrodes in the thin film transistor layer 22. The edges of the thin film encapsulation layer extend toward the positions of the grooves so that bumps and the grooves are covered by the thin film encapsulation layer and in the non-display area.

Figure 3:
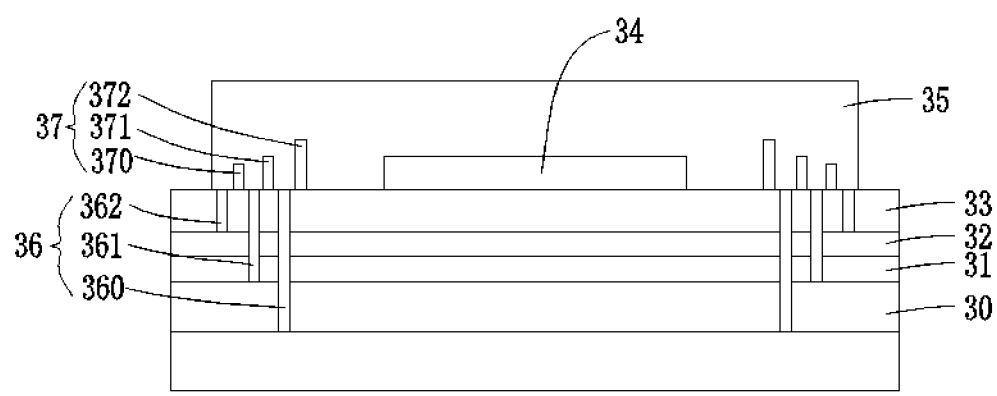
FIG. 3 is a schematic structural diagram of a display panel according to a second embodiment of the present invention.

Referring to FIG. 3, which is a schematic structural diagram of a display panel according to a second embodiment of the present invention. The second embodiment is different from the first embodiment in that bumps 37 are intertwined with the grooves 36 in a thin film transistor layer. Each of the bumps 37 is formed between the two adjacent grooves 36 while patterning the planarization layer, the pixel definition layer and an organic spacing layer having the spacers in the first embodiment.

Specifically, the grooves 36 include first grooves 360, second grooves 362 and third grooves 361. Formed through overlapping in the process of the first notch and the second notch. The first grooves 360 run through an interlayer insulating layer 33, a second gate insulating layer 32, a first gate insulating layer 31 and a buffer layer 30 in order. Formed in the process of the second notch, the second grooves 362 run through the interlayer insulating layer 33. Formed in the process of the through holes of source electrodes and drain electrodes, the third grooves 361 run through the interlayer insulating layer 33, the second gate insulating layer 32 and the first gate insulating layer 31 in order. The first grooves 360, the second grooves 362 and the third grooves 361 are disposed at an interval and in the area from edges of the light emitting layer 34 to the surroundings of the display panel in order. Specifically, the order of arrangement for the first grooves 360, the second grooves 362 and the third grooves 361 shall not be regarded as a limitation to the present disclosure.

The bumps 37 include: first bumps 372, located between the two adjacent grooves 36 and formed in the process of patterning the planarization layer; second bumps 371, located between the two adjacent grooves 36 through patterning the pixel definition layer on parts of the first bumps 372; and third bumps 370, located between the two adjacent grooves 36 through patterning the organic spacing layer formed on the pixel definition layer on parts of the second bumps 371 and in the non-display area. The spacers are formed in the display area while patterning the organic spacing layer. Without limitation, each of the grooves 37 has a trapezoid or ladder-shaped section.

The bumps 37 and the grooves 36 are disposed at an interval and in the surroundings of the non-display area. Formed on the light emitting layer 34, the thin film encapsulation layer 35 covers the bumps 37 and the grooves 36 in the non-display area.

Figure 4:
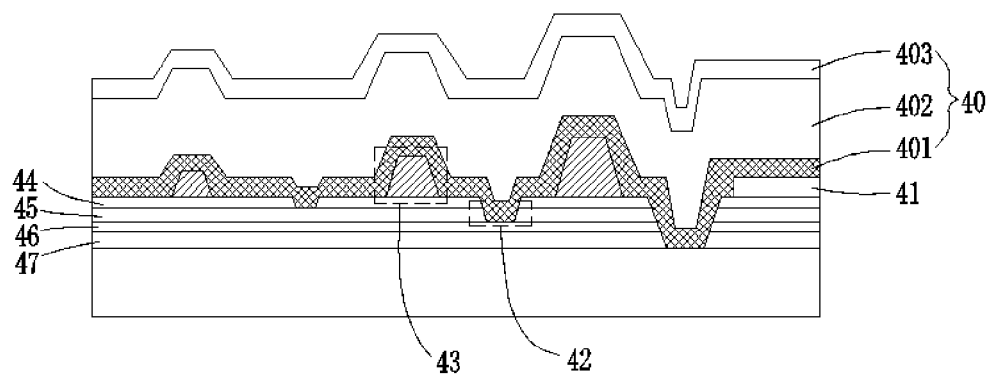
FIG. 4 is a schematic diagram of a partial structure of a display panel according to the second embodiment of the present invention.

Referring to FIG. 4, which is a schematic diagram of a partial structure of a display panel according to the second embodiment of the present invention. Corresponding to the non-display area of the display panel, the thin film encapsulation layer 40 and other layers that lie beneath it are embedded each other. The thin film encapsulation layer 40 includes: inorganic layers and organic layers, which overlap each other, wherein a first inorganic layer 401, a first organic layer 402 and a second inorganic layer 403 are merely shown. The grooves 42 and the bumps 43 are disposed in the surroundings of the light emitting layer 41 of the display panel. The thin film encapsulation layer 40 corresponding to the non-display area has a section whose shape matches the shapes of the bumps 43 and the grooves 42. Passing through the first grooves, the second grooves and the third grooves, the first inorganic layer 401 contacts the inorganic layer that lies beneath it, causing the performance of the encapsulation of the thin film encapsulation layer 40 to increase further. Corresponding to the area between the two adjacent grooves 42, the first inorganic layer 401 is formed on the bumps 43 that is formed after patterning the planarization layer, the pixel definition layer and the organic spacing layer. Being described in FIG. 3, the formation and the relation of positions of the grooves 42 and the bumps 43 are not repeated here.

Of course, in other embodiments, the grooves 42 can also partly run through an interlayer insulating layer 44 or a second gate insulating layer 45 or a first gate insulating layer 46 or a buffer layer 47. Without limitation, the bumps 43 can be patterns with different heights, formed by overlapping a planarization layer, a pixel definition layer and an organic spacing layer, or formed through patterning the planarization layer, the pixel definition layer and the organic spacing layer, having different thicknesses.

Figure 5:
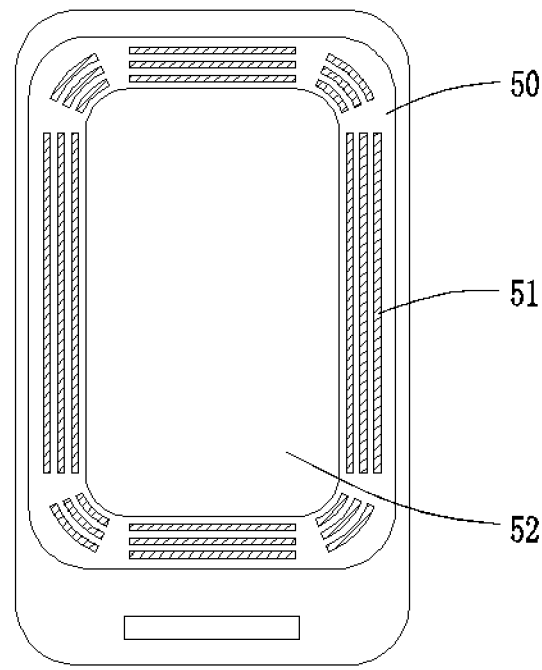
FIG. 5 is a top view of a display panel according to an embodiment of the present invention.

Referring to FIG. 5, which is a top view of a display panel according to an embodiment of the present invention. A thin film encapsulation layer 50 packages a light emitting layer 52 in a display area. Disposed on a thin film transistor layer contacting around the thin film encapsulation layer 50, grooves/bumps 51 are disposed at an interval and in the area from an edge of the light emitting layer 52 to the edge of the thin film encapsulation layer, which faces the same direction as the light emitting layer. The grooves/bumps 51 can continuously surround the light emitting layer 52. The grooves/bumps 51 can also be divided into sections, and disposed at an interval or intertwined with each other. Preferably, wherein the at least one bump and the plurality of grooves. Corresponding to the four corners and the four edges of the thin film transistor layer, the grooves/bumps 51 are divided into sections with an interval, so that the stresses existing in the four corners of the display panel can be reduced.

In the preparation of the array substrate of the display panel provided in the disclosure, grooves or bumps can be formed in a non-display area surrounding a display area while applying photolithography to different layers. In a thin film encapsulation process, a thin film encapsulation layer covers the grooves or the bumps in the non-display, so that the thin film encapsulation layer and the other layers that lie beneath it are embedded each other and thus tightly combined without peeling easily. At the same time, inorganic layers in the thin film encapsulation layer can contact inorganic layers in lower layers through the grooves, so that the sealing effect of the thin film encapsulation layer will be better. In addition, such design enlarges contacting areas between the thin film encapsulation layer and the other layers that lie beneath the thin film encapsulation layer, causing the abilities of adherence of the layers to further increase without peeling easily.

In conclusion, although the present invention has been described with reference to the foregoing preferred embodiments thereof, it is not limited to the foregoing preferred embodiments. It is apparent to those skilled in the art that a variety of modifications and changes may be made without departing from the scope of the present invention which is intended to be defined by the appended claims.

What is claimed is:

1. A display panel, comprising:
   a flexible substrate comprising a display area and a non-display area which is positioned around the display area;
   a thin film transistor layer formed on the flexible substrate;
   a plurality of grooves formed in the thin film transistor layer and positioned in the non-display area around the display area;
   a planarization layer disposed on the thin film transistor layer;
   a pixel definition layer disposed on the planarization layer and defining a pixel area;
   at least one bump formed in the parts of the planarization layer and the pixel definition layer, which are located in the non-display area, and located between each two adjacent grooves through patterning;
   a light emitting layer formed on the planarization layer and disposed corresponding to the pixel area; and
   a thin film encapsulation layer formed on the light emitting layer and configured to package the light emitting layer, wherein the thin film encapsulation layer covers the at least one bump and the plurality of grooves in the non-display area.

2. The display panel of claim 1, wherein the at least one bump or the plurality of grooves are disposed at an interval and in the area from an edge of the light emitting layer to the edge of the thin film encapsulation layer, which faces the same direction as the light emitting layer.

3. The display panel of claim 1, wherein the plurality of grooves having different depths are disposed in the layers from the thin film transistor layer to a surface of the flexible substrate.

4. The display panel of claim 1, wherein the thin film encapsulation layer corresponding to the non-display area has a section whose shape matches a shape of the at least one bump or shapes of the plurality of grooves.

5. The display panel of claim 1, wherein each of the plurality of grooves has a trapezoid or ladder-shaped section.

6. The display panel of claim 1, wherein the at least one bump comprises at least one first bump located between the two adjacent grooves through patterning the planarization layer.

7. The display panel of claim 6, wherein at least one second bump is located between the two adjacent grooves through patterning the pixel definition layer on parts of the at least one first bump.

8. The display panel of claim 7, further comprising an organic spacing layer formed on the pixel definition layer, wherein at least one third bump is located between the two adjacent grooves through patterning the organic spacing layer on parts of the at least one second bump and in the non-display area.

9. The display panel of claim 1, wherein the at least one bump has a trapezoid or ladder-shaped section.

10. A display panel, comprising:
   a flexible substrate comprising a display area and a non-display area which is positioned around the display area;
   a thin film transistor layer formed on the flexible substrate;
   a plurality of grooves formed in the thin film transistor layer and positioned in the non-display area around the display area;
   a planarization layer disposed on the thin film transistor layer;
   a pixel definition layer disposed on the planarization layer and defining a pixel area;
   at least one bump formed in the parts of the planarization layer and the pixel definition layer, which are located in the non-display area, and located between each two adjacent grooves through patterning;
   a light emitting layer formed on the planarization layer and disposed corresponding to the pixel area; and
   a thin film encapsulation layer formed on the light emitting layer and configured to package the light emitting layer, wherein the thin film encapsulation layer covers the at least one bump and the plurality of grooves in the non-display and wherein the at least one bump and the plurality of grooves, corresponding to the thin film transistor layer in the non-display area, are divided into sections and disposed at an interval.

11. The display panel of claim 10, wherein the at least one bump or the plurality of grooves are disposed at an interval and in the area from an edge of the light emitting layer to the edge of the thin film encapsulation layer, which faces the same direction as the light emitting layer.

12. The display panel of claim 10, wherein the plurality of grooves having different depths are disposed in the layers from the thin film transistor layer to a surface of the flexible substrate.

13. The display panel of claim 10, wherein the thin film encapsulation layer corresponding to the non-display area has a section whose shape matches a shape of the at least one bump or shapes of the plurality of grooves.

14. The display panel of claim 10, wherein each of the plurality of grooves has a trapezoid or ladder-shaped section.

15. The display panel of claim 10, wherein the at least one bump comprises at least one first bump located between the two adjacent grooves through patterning the planarization layer.

16. The display panel of claim 15, wherein at least one second bump is located between the two adjacent grooves through patterning the pixel definition layer on parts of the at least one first bump.

17. The display panel of claim 16, further comprising an organic spacing layer formed on the pixel definition layer, wherein at least one third bump is located between the two adjacent grooves through patterning the organic spacing layer on parts of the at least one second bump and in the non-display area.

18. The display panel of claim 10, wherein the at least one bump has a trapezoid or ladder-shaped section.

* * * * *